United States Patent
Fest

(10) Patent No.: US 9,385,043 B2
(45) Date of Patent: Jul. 5, 2016

(54) SPACER ENABLED POLY GATE

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 183 days.

(21) Appl. No.: 13/838,086

(22) Filed: Mar. 15, 2013

(65) Prior Publication Data

US 2014/0264614 A1 Sep. 18, 2014

(51) Int. Cl.
*H01L 21/8234* (2006.01)
*H01L 27/088* (2006.01)
*H01L 21/28* (2006.01)

(52) U.S. Cl.
CPC .. *H01L 21/823437* (2013.01); *H01L 21/28141* (2013.01); *H01L 27/088* (2013.01)

(58) Field of Classification Search
CPC ............. H01L 21/28141; H01L 29/6653; H01L 29/66553; H01L 29/66583; H01L 29/66545; H01L 21/0337; H01L 21/28132; H01L 21/2815; H01L 29/6656
USPC .......................... 438/584, 585, 587
See application file for complete search history.

(56) References Cited

U.S. PATENT DOCUMENTS

| | | | | |
|---|---|---|---|---|
| 5,918,132 A * | 6/1999 | Qian et al. | ..................... | 438/299 |
| 6,001,688 A * | 12/1999 | Rizzuto | ............ | H01L 21/02071 257/E21.682 |
| 6,214,670 B1 * | 4/2001 | Shih | .................. | H01L 29/66613 257/E21.428 |
| 6,355,528 B1 * | 3/2002 | Ishida | ............... | H01L 21/26586 257/E21.345 |
| 6,358,798 B1 * | 3/2002 | Chen | .................. | H01L 29/66583 257/330 |
| 6,495,401 B1 * | 12/2002 | Hsu | ..................... | H01L 27/1203 257/E21.703 |
| 2014/0110798 A1 * | 4/2014 | Cai | ......................... | H01L 29/78 257/410 |

FOREIGN PATENT DOCUMENTS

EP 0528742 A1 2/1993 ............. H01L 21/28

OTHER PUBLICATIONS

International Search Report and Written Opinion, Application No. PCT/US2014/019742, 12 pages, Jun. 16, 2014.

* cited by examiner

*Primary Examiner* — Matthew W Such
*Assistant Examiner* — David Spalla
(74) *Attorney, Agent, or Firm* — Slayden Grubert Beard PLLC

(57) ABSTRACT

A spacer etching process produces ultra-narrow polysilicon and gate oxides for insulated gates used with insulated gate transistors. Narrow channels are formed using dielectric and spacer film deposition techniques. The spacer film is removed from the dielectric wherein narrow channels are formed therein. Insulating gate oxides are grown on portions of the semiconductor substrate exposed at the bottoms of these narrow channels. Then the narrow channels are filled with polysilicon. The dielectric is removed from the face of the semiconductor substrate, leaving only the very narrow gate oxides and the polysilicon. The very narrow gate oxides and the polysilicon are separated into insulated gates for the insulated gate transistors.

12 Claims, 15 Drawing Sheets

(f)

(e)

(d)

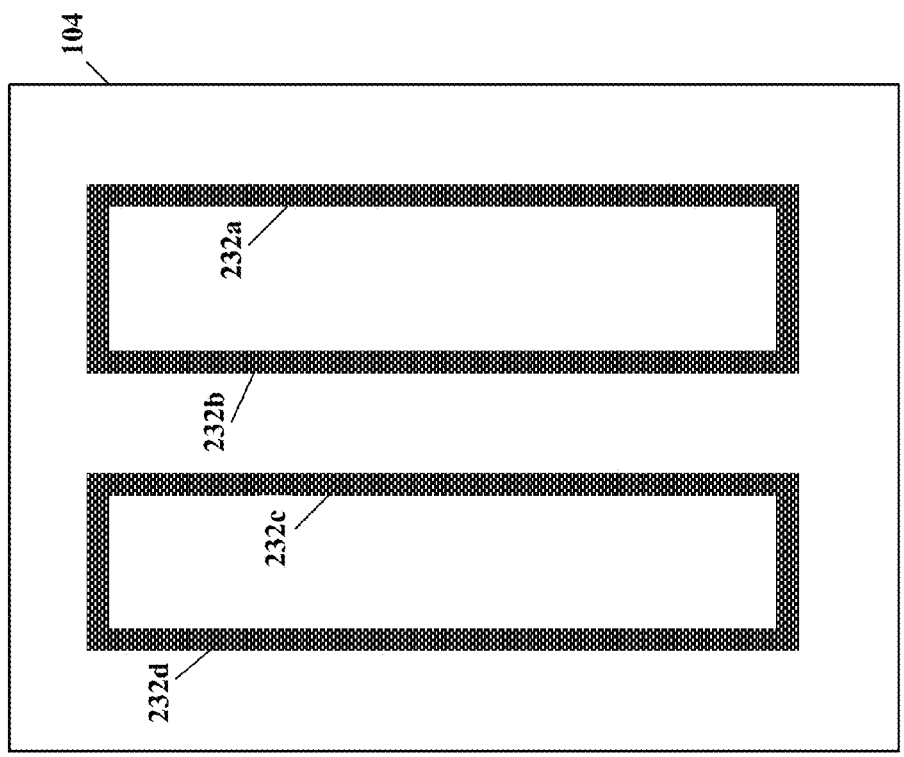

SPACER ENABLED POLY GATE

TECHNICAL FIELD

The present disclosure relates to semiconductor integrated circuit (IC) fabrication, and more particularly, to forming sub-lithographic patterns of polysilicon insulated gates in the semiconductor die (e.g., integrated circuit die) during fabrication thereof.

BACKGROUND

Reduction in the size of patterned polysilicon insulated gates used for insulated gate transistors, e.g., insulated-gate field-effect transistors (IGFETs) also known as metal oxide field effect transistors (MOSFETs), and insulated-gate bipolar transistors (IGBTs) in a semiconductor die have been limited by the lithographic processes available. As the number of these transistors have increased on the semiconductor die resulting from improvements in the lithographic masking processes forming these transistors, the insulated-gates used with these ever decreasing in size transistors have been unable to decrease proportionally in size with the smaller transistors.

SUMMARY

Therefore, there is need for a way to decrease the size of patterned insulated gates for transistors without the limitations of the lithographic processes available for manufacturing semiconductor integrated circuits.

According to an embodiment, a method for forming insulated polysilicon gates on a semiconductor integrated circuit die may comprise the steps of: depositing a first dielectric on a face of a semiconductor substrate; creating at least one trench in the first dielectric down to a face of the semiconductor substrate; depositing a spacer film on the first dielectric including walls and a bottom of the at least one trench; removing portions of the spacer film from a face of the first dielectric and the bottom of the at least one trench exposing the face of the semiconductor substrate, wherein only spacer films remain on the walls of the at least one trench; depositing a second dielectric over the first dielectric and between the spacer films on the walls of the at least one trench sufficient to fill a space therebetween; removing a portion of the first and second dielectrics until substantially flat top portions of the spacer films may be exposed between the first and second dielectrics; removing the spacer films between the first and second dielectrics to the exposed face of the semiconductor substrate, thereby leaving at least two narrow channels therein; growing gate oxides on exposed faces of the semiconductor substrate at the bottoms of the at least two narrow channels; depositing polysilicon on the faces of the first and second dielectrics and into the at least two narrow channels; removing portions of the polysilicon on the faces of the first and second dielectrics and top portions thereof in the at least two narrow channels; removing the first and second dielectrics from the face of the semiconductor substrate leaving the polysilicon and gate oxides thereon; and separating portions of the polysilicon and gate oxides into independent insulated gates for insulated gate transistors.

According to a further embodiment of the method, the step of depositing the first dielectric may comprise the step of depositing the first dielectric to a thickness of from about 5 to about 1000 nanometers on the face of the semiconductor substrate. According to a further embodiment of the method, the step of creating the at least one trench may comprise the step of creating the at the least one trench having a width of from about 5 to about 1000 nanometers in the first dielectric. According to a further embodiment of the method, the step of depositing the spacer film may comprise the step of depositing the spacer film to a thickness of from about 5 to about 1000 nanometers. According to a further embodiment of the method, the step of depositing the second dielectric may comprise the step of depositing the second dielectric to a thickness of from about 5 to about 1000 nanometers. According to a further embodiment of the method, the widths of the polysilicon and the gate oxides may be from about 5 to about 500 nanometers.

According to a further embodiment of the method, the spacer film may comprise Silicon Dioxide. According to a further embodiment of the method, the first dielectric may comprise Silicon Nitride. According to a further embodiment of the method, the second dielectric may comprise Silicon Nitride.

According to a further embodiment of the method, the step of separating portions of the polysilicon and gate oxides may comprise the step of separating portions of the polysilicon and gate oxides with reactive-ion etching (RIE). According to a further embodiment of the method, the RIE may be aggressive. According to a further embodiment of the method, the step of separating portions of the polysilicon and gate oxides may comprise the step of creating vias between the portions of the polysilicon and gate oxides to be separated.

According to another embodiment, a semiconductor die may comprise: a plurality of insulated gate transistors, wherein insulated gates of said transistors may be created comprising the steps of: depositing a first dielectric on a face of a semiconductor substrate; creating at least one trench in the first dielectric down to a face of the semiconductor substrate; depositing a spacer film on the first dielectric including walls and a bottom of the at least one trench; removing portions of the spacer film from a face of the first dielectric and the bottom of the at least one trench exposing the face of the semiconductor substrate, wherein only spacer films remain on the walls of the at least one trench; depositing a second dielectric over the first dielectric and between the spacer films on the walls of the at least one trench sufficient to fill a space therebetween; removing a portion of the first and second dielectrics until substantially flat top portions of the spacer films may be exposed between the first and second dielectrics; removing the spacer films between the first and second dielectrics to the exposed face of the semiconductor substrate, thereby leaving at least two narrow channels therein; growing gate oxides on exposed faces of the semiconductor substrate at the bottoms of the at least two narrow channels; depositing polysilicon on the faces of the first and second dielectrics and into the at least two narrow channels; removing portions of the polysilicon on the faces of the first and second dielectrics and top portions thereof in the at least two narrow channels; removing the first and second dielectrics from the face of the semiconductor substrate leaving the polysilicon and gate oxides thereon; and separating portions of the polysilicon and gate oxides into independent insulated gates for insulated gate transistors.

According to a further embodiment, the first dielectric may have a thickness of from about 5 to about 1000 nanometers. According to a further embodiment, the at the least one trench may have a width from about 5 to about 1000 nanometers. According to a further embodiment, the spacer films may have a thickness of from about 5 to about 1000 nanometers. According to a further embodiment, the second dielectric may have a thickness from about 5 to about 1000 nanometers.

According to a further embodiment, the widths of the polysilicon and the gate oxides may be from about 5 to about 500 nanometers.

According to a further embodiment, the spacer film may comprise Silicon Dioxide. According to a further embodiment, the first and second dielectrics may comprise Silicon Nitride.

BRIEF DESCRIPTION OF THE DRAWINGS

A more complete understanding of the present disclosure may be acquired by referring to the following description taken in conjunction with the accompanying drawings wherein:

FIG. 4 illustrates a schematic plan view diagram of a plurality of sub-lithographic patterns of insulated polysilicon gates formed on a semiconductor die, according to a specific example embodiment of this disclosure;

Figure 1:
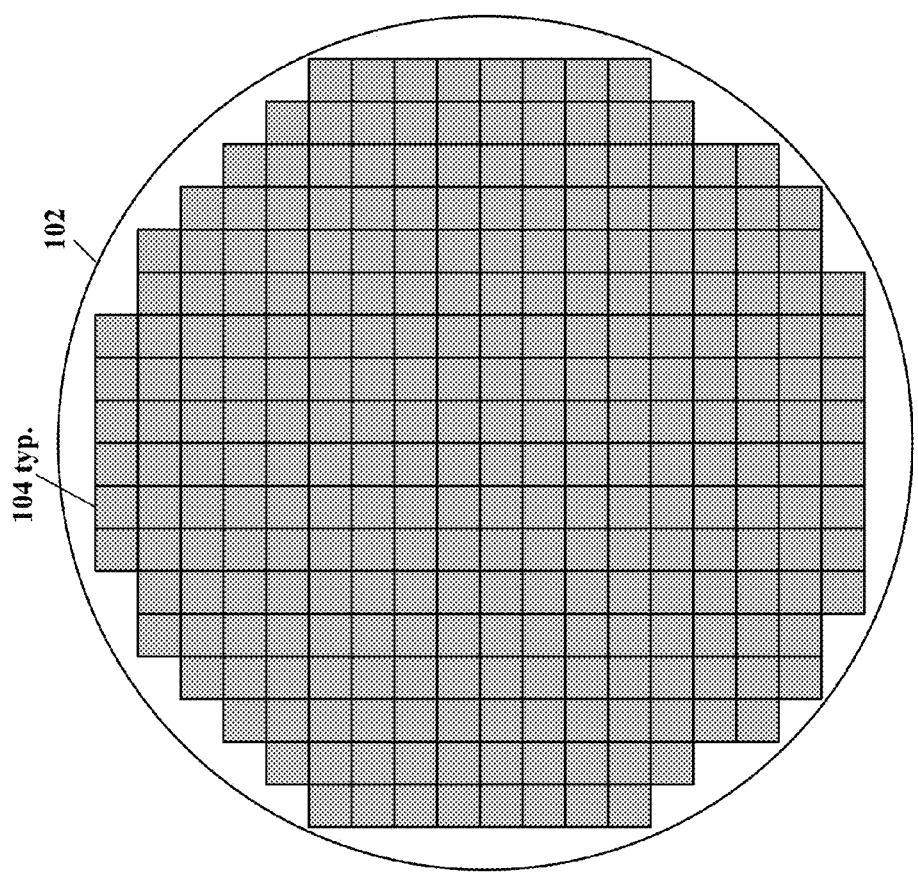
FIG. 1 illustrates a schematic plan view diagram of a semiconductor integrated circuit wafer comprising a plurality of semiconductor dice.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a spacer etching process may be used to produce at least one trench in a first dielectric deposited onto a face of a semiconductor die, wherein a portion of the semiconductor die may be exposed at the bottom of the at least one trench. A spacer film may be deposited to a desired thickness onto a face of the first dielectric, including walls of the at least one trench and at the exposed portion of the semiconductor die at the bottom thereof. Then the spacer film may be removed from the face of the first dielectric and the exposed portion of the semiconductor die at the bottom of the at least one trench, leaving only spacer films on the walls of the at least one trench. This may be accomplished by, for example but is not limited to, etching the spacer film from the face of the first dielectric and the portion of the semiconductor die exposed at the bottom of the at least one trench. Next a second dielectric may be deposited over the first dielectric, the spacer films on the walls of the trenches and the portion of the semiconductor die exposed at the bottom of the at least one trench, wherein a gap between the spacer films on the walls of the at least one trench may be filled in with the second dielectric. Then a portion of the second dielectric may be removed by, for example but is not limited to, polishing, until the tops of the spacer films on the walls of the at least one trench are again exposed.

Next the spacer film may be removed by, for example but is not limited to, dip-out, where the dip-out process has good selectivity so as not to remove the dielectric material but effectively removes all of the spacer film from the narrow channels remaining between the first dielectric walls and the second dielectric walls formed from the previous process step. However, a slight etch of the dielectric material may round the top corners of these narrow channels that may improve filling thereof. Then gate oxides may be selectively grown on the exposed semiconductor substrate at the bottoms of the narrow channels. Next a polysilicon layer may be deposited over the first and second dielectrics, into the narrow channels and over the gate oxides at the bottoms of the narrow channels. Then the polysilicon layer may be removed by, for example but is not limited to, etching, to remove it from the top faces of the first and second dielectrics and slightly into the top portions of the narrow channels. Thereafter the first and second dielectrics are removed from the face of the semiconductor die, wherein the polysilicon and gate oxide remain on the face thereof.

Portions of the polysilicon may be removed at appropriate locations (e.g., "broken") to produce desired insulated gate patterns comprising the gate oxide and polysilicon thereover. The trench depth helps in determining one dimension of the gate oxide and polysilicon, e.g., height, and a thickness of the spacer film on the walls of the at least one trench determines a second dimension, e.g., width. Lengths of the polysilicon and gate oxide are determined by where the polysilicon and gate oxide are "broken," e.g., separated, disconnections made therebetween, etc., from each other.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic plan view diagram of a semiconductor integrated circuit wafer comprising a plurality of semiconductor dice. A silicon wafer 102 may be scribed into a plurality of semiconductor dice 104 for further processing to create planar transistors, diodes and conductors on each of the plurality of semiconductor dice 104. After all circuits have been fabricated on the plurality of semiconductor dice 104, the dice 104 are singulated (separated) and packaged into integrated circuits (not shown).

Figure 2:
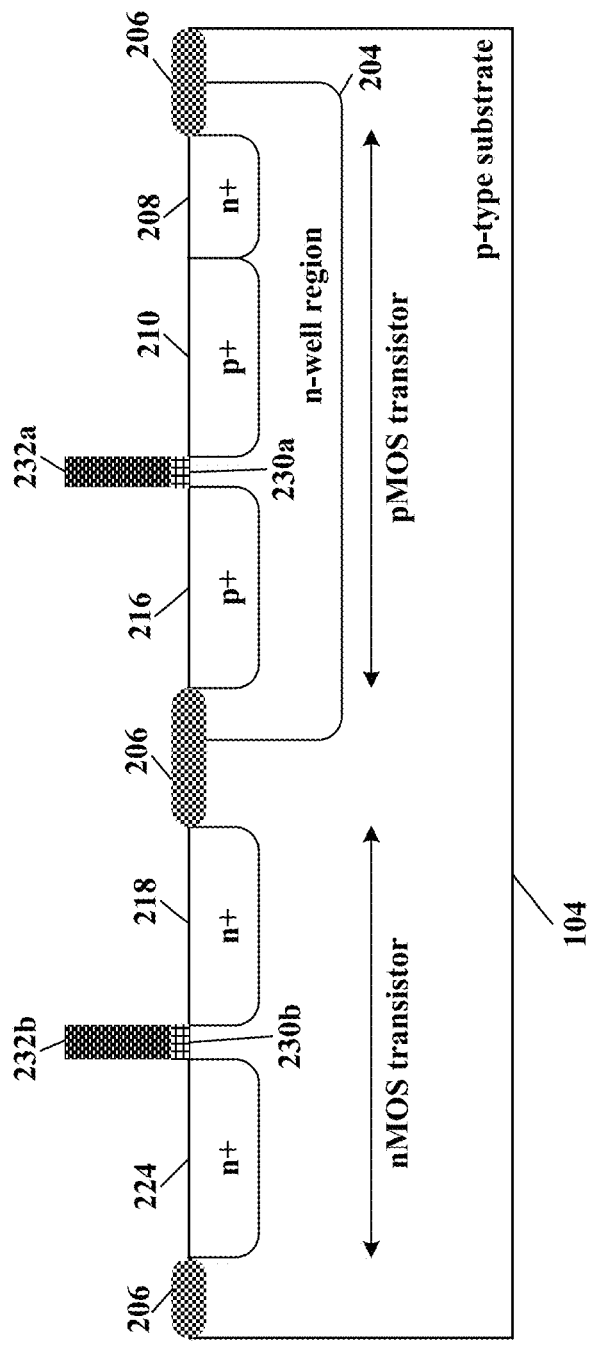
FIG. 2 illustrates a schematic elevational diagram of P-channel and N-channel field effect transistors fabricated on a semiconductor substrate.
Figure 3:
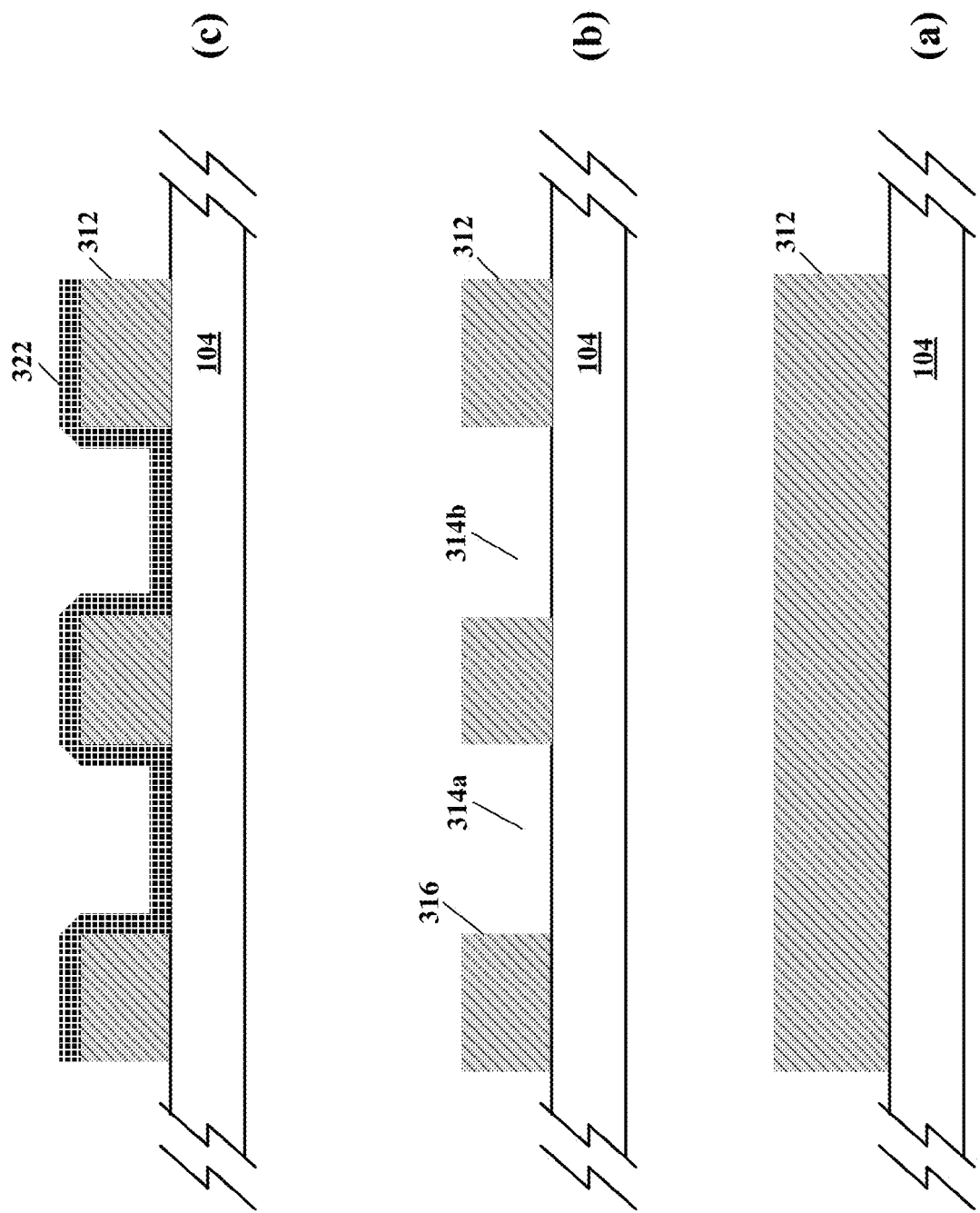
FIGS. 3, 3A, 3B and 3C illustrate schematic elevational diagrams of semiconductor fabrication steps for forming sub-lithographic patterns of insulated polysilicon gates on a semiconductor die, according to a specific example embodiment of this disclosure.
Figure 3A:
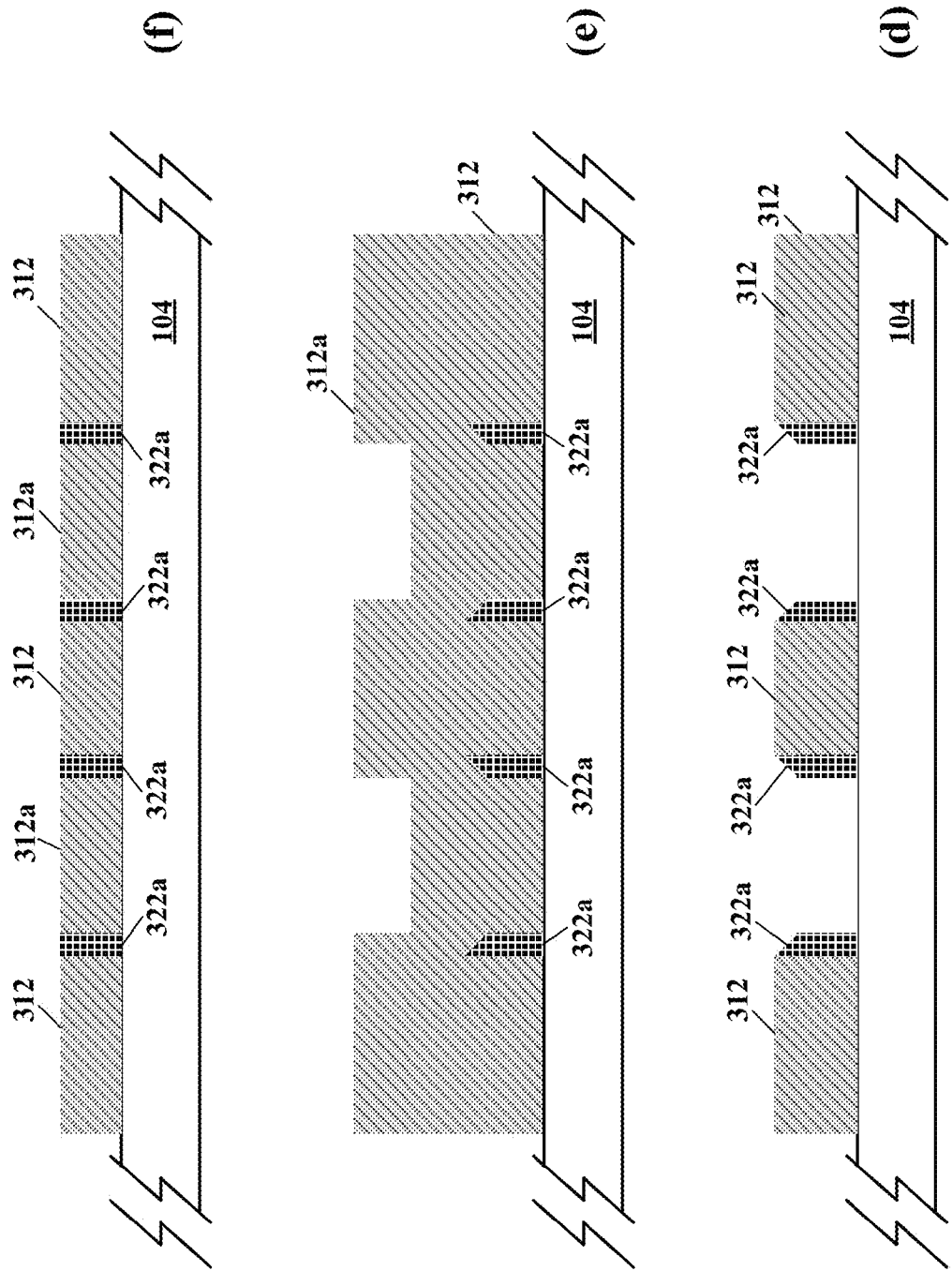
Figure 3B:
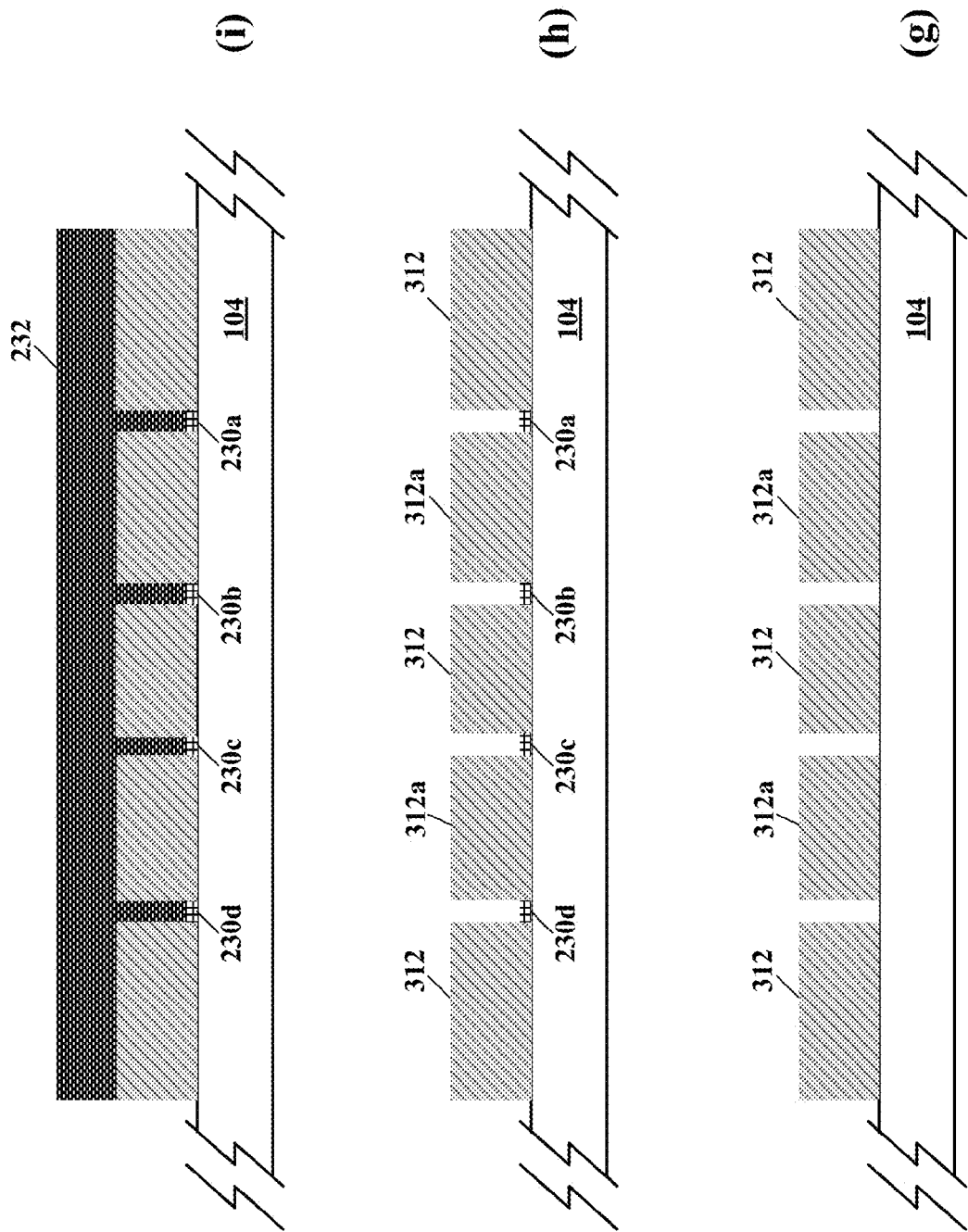
Figure 3C:
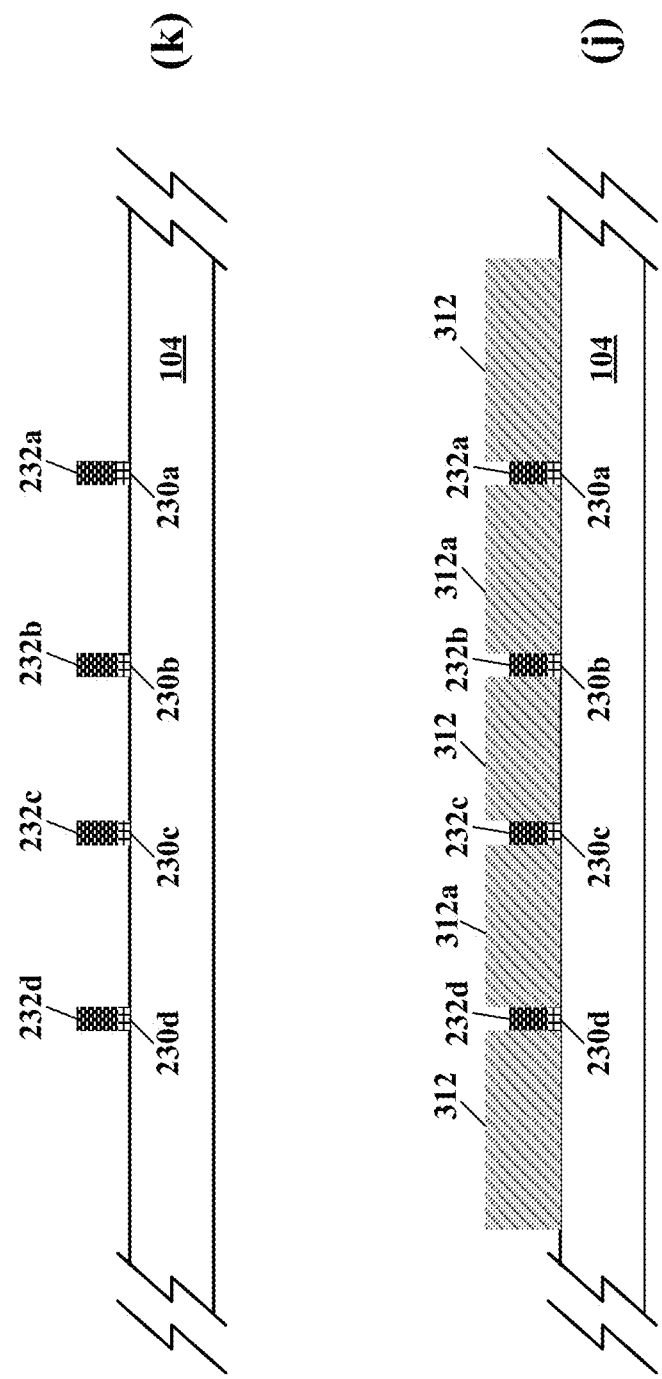

Referring to FIG. 2, depicted is a schematic elevational diagram of P-channel and N-channel field effect transistors fabricated on a semiconductor substrate. P-channel and N-channel field effect transistors may be fabricated on a silicone semiconductor substrate 104 and used independently or together as a complementary metal oxide semiconductor (CMOS) device. The P-channel transistor may comprise an n-well region 204 in a p-type substrate 104, a p+ source 210, an n+ n-well contact 208, a p+ drain 216, a gate oxide 230a and a polysilicon gate 232a insulated from the substrate 104 by the gate oxide 230a. The N-channel transistor may comprise an n+ drain 218, an n+ source 224, a gate oxide 230b and a polysilicon gate 232b insulated from the substrate 104 by the gate oxide 230b. Field oxide (FOX) 206 (e.g., silicon dioxide) may be used to isolate and protect the underlying transistor elements and the substrate.

Referring to FIGS. 3, 3A, 3B and 3C, depicted are schematic elevational diagrams of semiconductor fabrication steps for forming sub-lithographic patterns of insulated polysilicon gates on a semiconductor die, according to a specific example embodiment of this disclosure. The first step (a) in forming sub-lithographic patterns of insulated polysilicon gates is shown in FIG. 2 wherein a first dielectric 312 may be deposited on a surface of each one of the plurality of semiconductor dice 104. In the next step (b) the first dielectric 312 may have at least one trench 314 etched therein to a depth that exposes a portion of the semiconductor die 104 at the bottom of the at least one trench. The at least one trench 314 may comprise walls 316 and a bottom exposing a portion of the semiconductor die. In step (c) a spacer film 322 may be deposited over the first dielectric 312, the walls 316 and the exposed portion of the semiconductor die 104 at the bottom of the at least one trench 314. In step (d) the spacer film 322 may be selectively etched from the face of the first dielectric 312 and the exposed portion of the semiconductor die 104, leaving only spacer films 322 on the walls 316 of the at least one trench 314.

In step (e) a second dielectric 312a may be deposited over the exposed surfaces of the first dielectric 312 and the spacer films 322a sufficiently thick enough to fill in the gap therebetween. In step (f) a portion of the second dielectric 312a may be removed, e.g., polished, sufficiently deep enough to go past and remove the rounded tops of the spacer films 322a, otherwise there may be a re-entrant profile that may be very difficult to fill. In step (g) the spacer films 322a may be removed from between the walls of the first and second dielectrics 312 and 312a by, for example but is not limited to, selective wet or plasma etching, thereby leaving ultra thin channels, e.g., trenches, furrows or grooves, therein. The selective etching may also round off the top corners of these very narrow channels which may improve filling material therein. In step (h) gate oxides may be selectively grown on the exposed semiconductor substrate at the bottoms of the narrow channels. In step (i) a polysilicon layer may be deposited over the first and second dielectrics 312 and 312a, into the narrow channels and over the gate oxides 230.

In step (j) the polysilicon layer 232 may be removed by, for example but is not limited to, etching, to remove it from the top faces of the first and second dielectrics 312 and 312a, and slightly into the top portions of the narrow channels. In step (k) the first and second dielectrics 312 and 312a are removed from the face of the semiconductor die 104, wherein the polysilicon 232 and gate oxide 230 remain on the face thereof. The depth of the trench 314 may determine the height and the thickness of the deposited spacer film 322 may determine the thickness of the polysilicon 232.

The first dielectric layer 312 may be, for example but is not limited to, Silicon Nitride. The second dielectric layer 312a may be, for example but is not limited to, Silicon Nitride. The spacer film 222 may be, for example but is not limited to, Silicon Dioxide. The gate oxide 230 may be, for example but is not limited to, Silicon Dioxide. The polysilicon 232 may be, for example but is not limited to, poly Silicon, amorphous Silicon.

The layer thickness of the first dielectric 312 may be from about 5 to about 1000 nanometers. The layer thickness of the second dielectric 312a may be from about 5 to about 1000 nanometers. The layer thickness of the spacer film 322 may be from about 5 to about 1000 nanometers. The width or thickness of the polysilicon 232 and gate oxide 230 may be from about 5 to about 500 nanometers.

Figure 5:
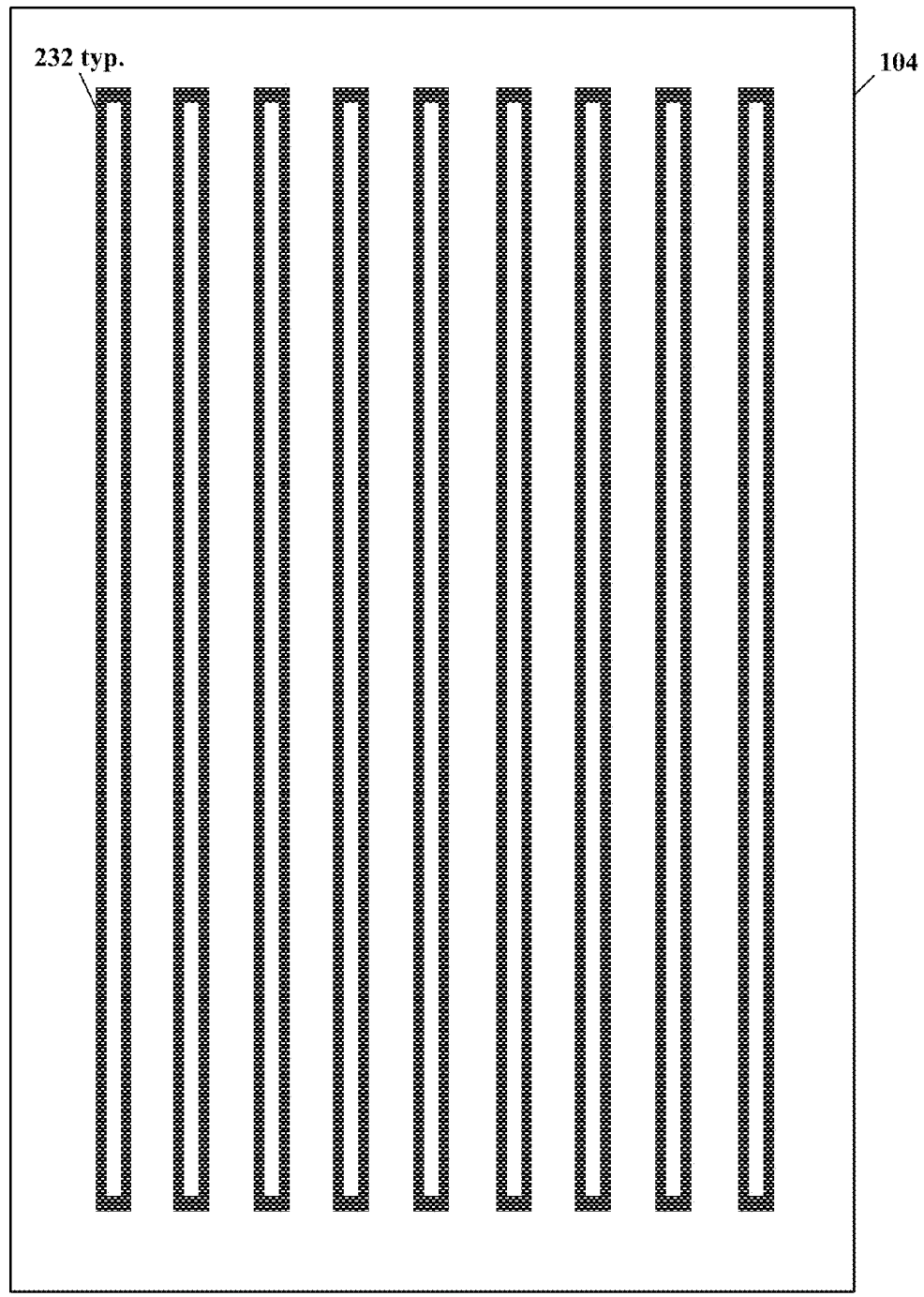
FIG. 5 illustrates a schematic plan view diagram of a plurality of sub-lithographic patterns of insulated polysilicon gates formed on a semiconductor die, according to a specific example embodiment of this disclosure.

Referring to FIGS. 4 and 5, depicted are schematic plan view diagrams of a plurality of sub-lithographic patterns of insulated polysilicon gates formed in a semiconductor die, according to specific example embodiments of this disclosure. After removal of the first and second dielectrics 312 and 312a as shown in step (k) of FIG. 3C, the polysilicon 232 and gate oxide 230 are ready for further processing to separate portions thereof to form insulated gates for the insulated gate transistors of the semiconductor die 104. The plurality of polysilicon 232 and gate oxides 230 shown in FIG. 5 may be advantageously used for fabrication of a plurality of insulated gate transistors in an array.

Figure 6:
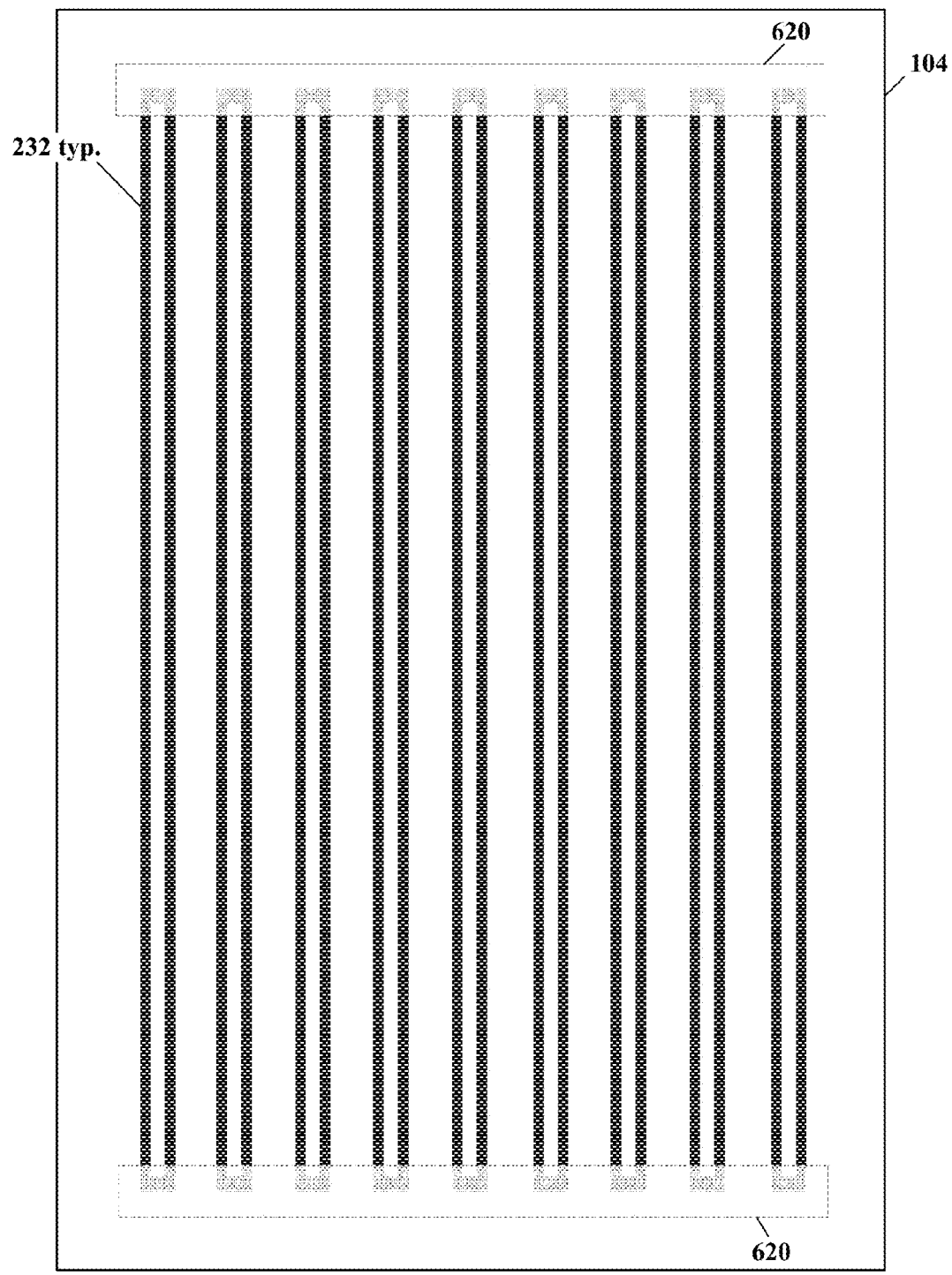
FIG. 6 illustrates a schematic plan view diagram of the plurality of sub-lithographic patterns of insulated polysilicon gates shown in FIG. 5 being prepared for separating the insulated polysilicon gates from each other, according to a specific example embodiment of this disclosure.

Referring to FIG. 6, depicted is a schematic plan view diagram of the plurality of sub-lithographic patterns of insulated polysilicon gates shown in FIG. 5 being prepared for separating the insulated polysilicon gates from each other, according to a specific example embodiment of this disclosure. The ends of the polysilicon 232, represented by the numeral 620, are to be broken, e.g., separated apart, disconnections made therebetween, etc. The ends 620 may be routed to a "safe" area on the die 104 and may be "severed" (cut) with a removal process such as, for example but not limited to, aggressive reactive-ion etching (RIE), where the ends 620 are exposed and the remainder of the polysilicon 232 are protected from the RIE, e.g., masked.

Figure 7:
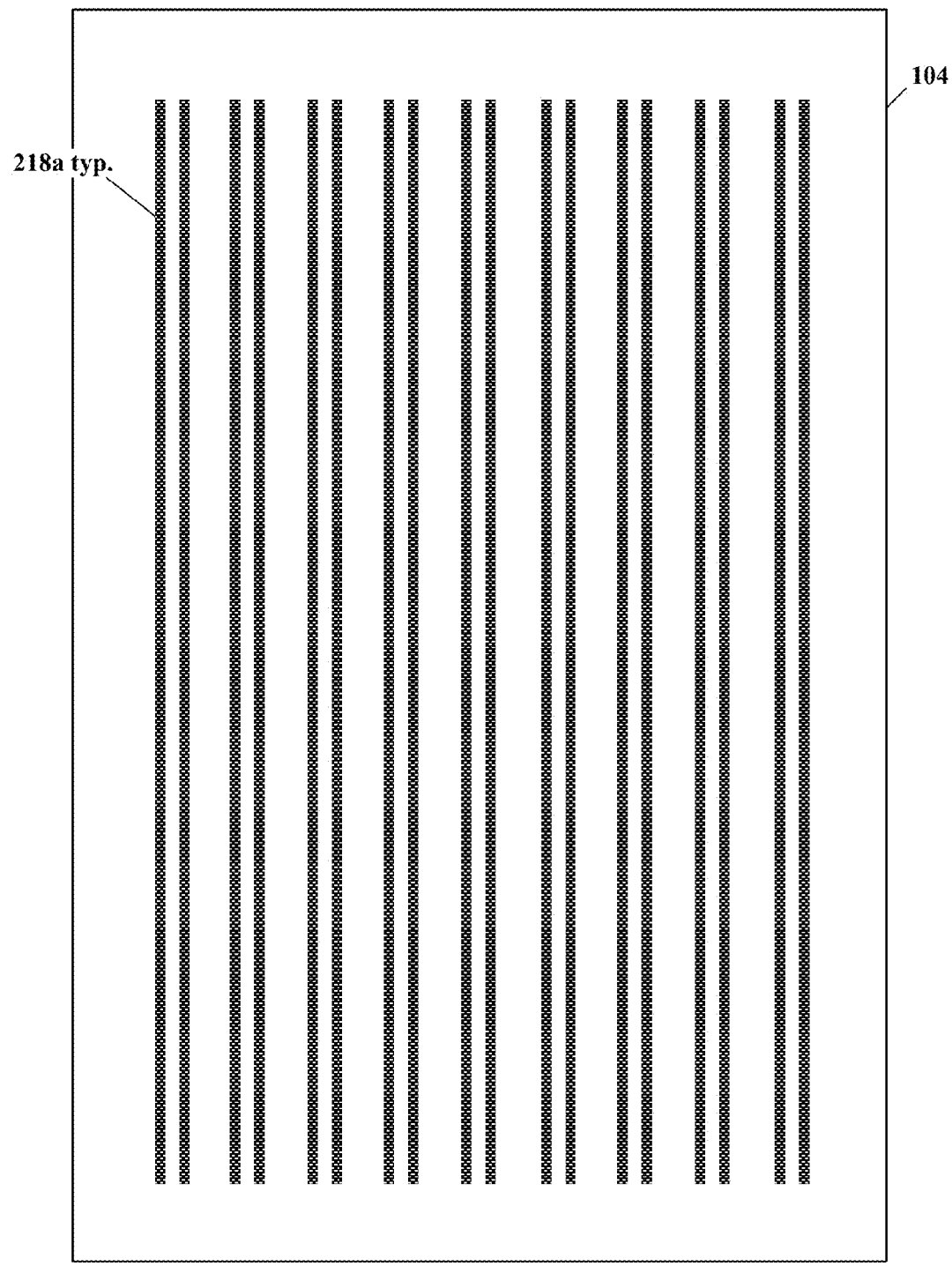
FIG. 7 illustrates a schematic plan view diagram of the plurality of sub-lithographic patterns of insulated polysilicon gates shown in FIGS. 5 and 6 with portions of the insulated polysilicon gates removed to separate the insulated polysilicon gates from each other, according to a specific example embodiment of this disclosure.

Referring to FIG. 7, depicted is a schematic plan view diagram of the plurality of sub-lithographic patterns of insulated polysilicon gates shown in FIGS. 5 and 6 with portions of the insulated polysilicon gates removed to separate the insulated polysilicon gates from each other, according to a specific example embodiment of this disclosure. After the ends 620 have been removed, further processing may be done to add conductors to the elements of the insulated gate transistors and for external connections thereto.

Figure 8:
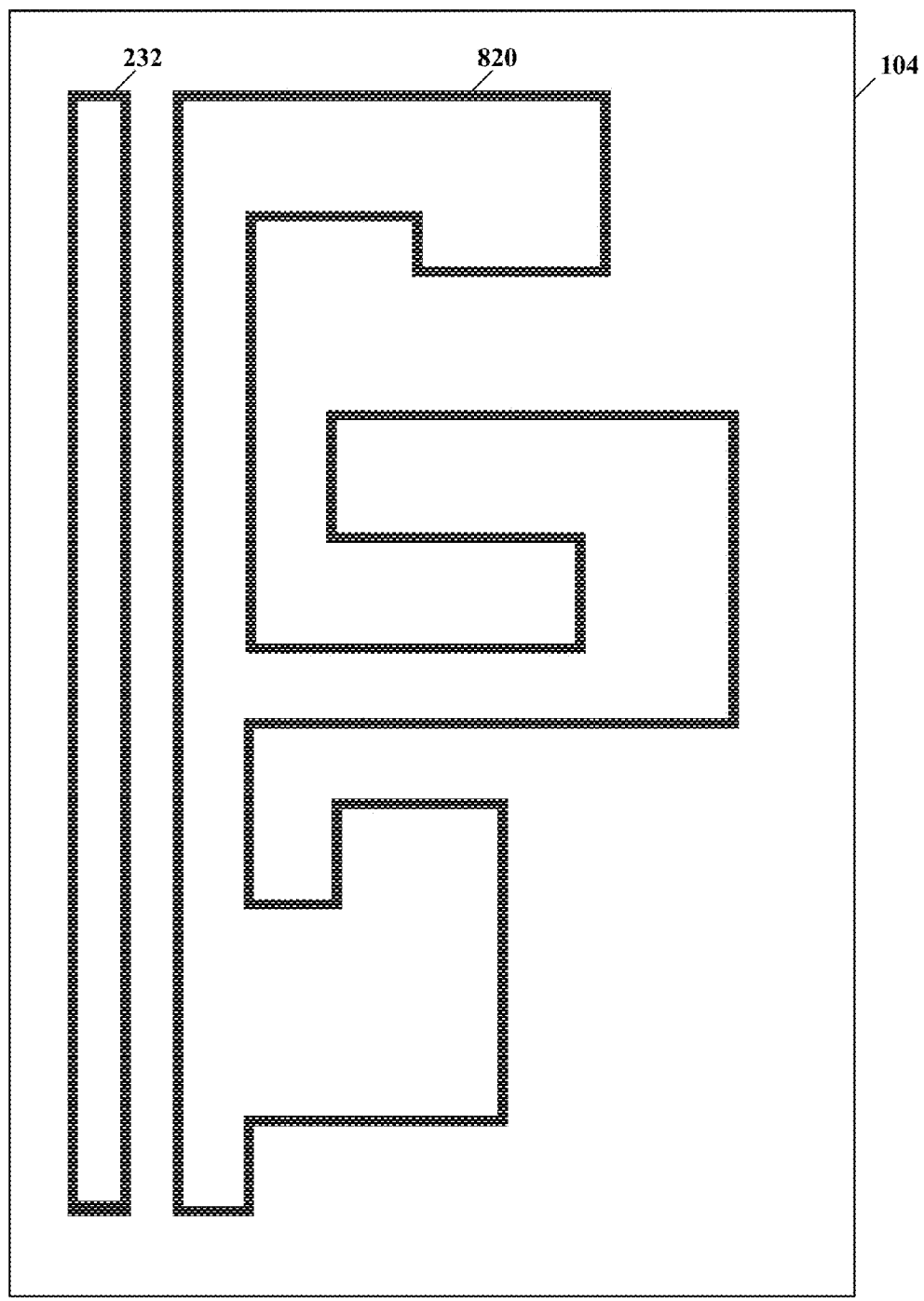
FIG. 8 illustrates a schematic plan view diagram of a plurality of sub-lithographic patterns of insulated polysilicon gates having various routing paths that are formed on a semiconductor die, according to another specific example embodiment of this disclosure.

Referring to FIG. 8, depicted is a schematic plan view diagram of a plurality of sub-lithographic patterns of insulated polysilicon gates having various routing paths that are formed on a semiconductor die, according to another specific example embodiment of this disclosure. The polysilicon 232 as shown has been described more fully hereinabove. It is contemplated and with the scope of this disclosure that polysilicon 820 may be routed in as many different paths as desired and configured as insulated polysilicon gates for transistors on the semiconductor die 104. The steps for creating a trench of this pattern and creating the polysilicon 820 may be formed through appropriate masks (not shown) and the same or similar processes as the process steps shown in FIGS. 3, 3A, 3B and 3c, and the accompanying descriptions thereof as more fully described hereinabove.

Figure 9:
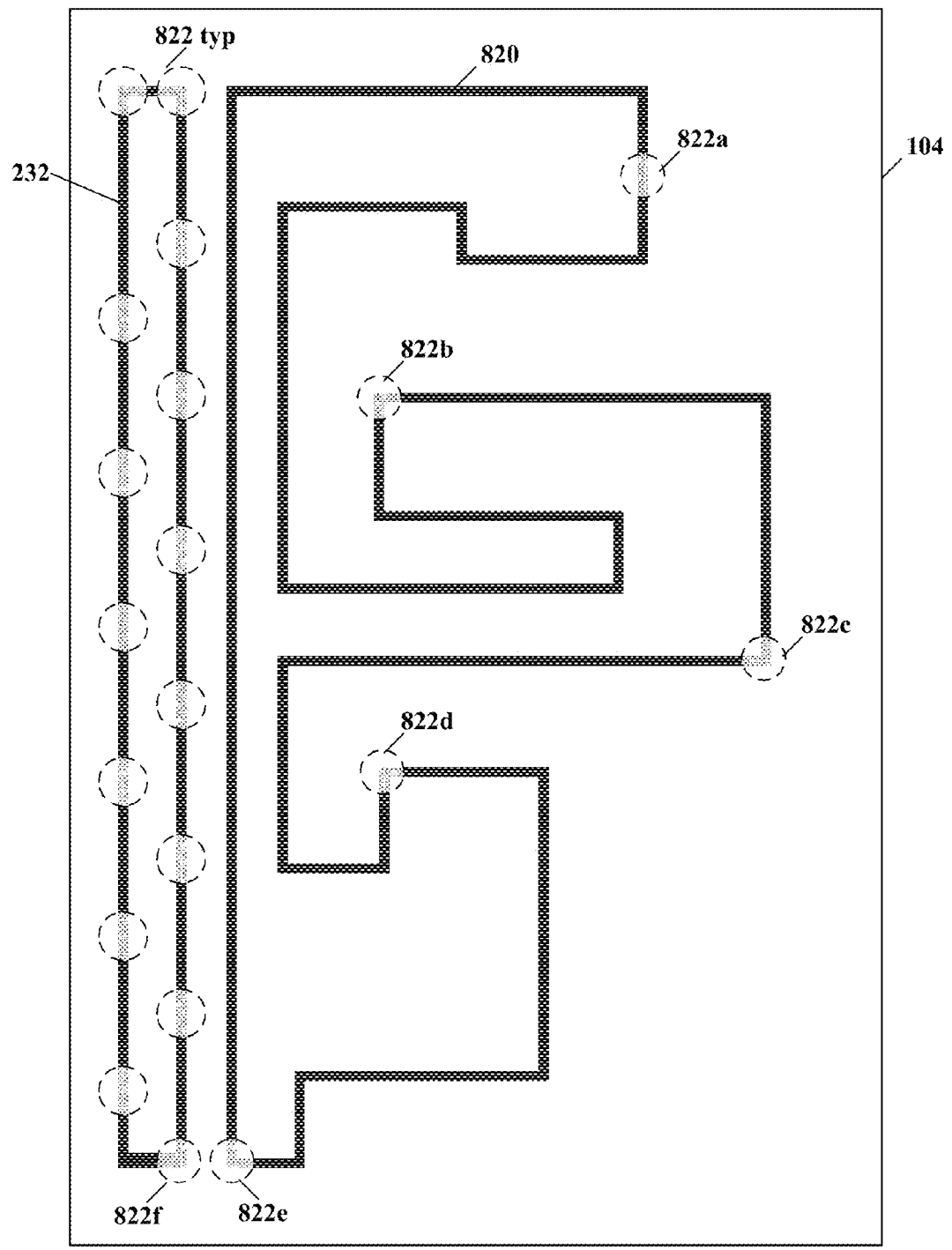
FIG. 9 illustrates a schematic plan view diagram of a plurality of sub-lithographic patterns of insulated polysilicon gates having various routing paths as shown in FIG. 8 being prepared for separation into independent insulated polysilicon gates on a semiconductor die, according to another specific example embodiment of this disclosure.

Referring to FIG. 9, depicted is a schematic plan view diagram of a plurality of sub-lithographic patterns of insulated polysilicon gates having various routing paths as shown in FIG. 8 being prepared for separation into independent insulated polysilicon gates for transistors in the semiconductor die 104, according to another specific example embodiment of this disclosure. The polysilicon 820 may be separated, e.g., disconnections made therebetween, at various locations, generally represented by the numeral 822, on the semiconductor die 104. These separation locations 822 may be accomplished using Via style processes as is well known to those having ordinary skill in the art of semiconductor manufacturing and having the benefit of this disclosure.

Figure 10:
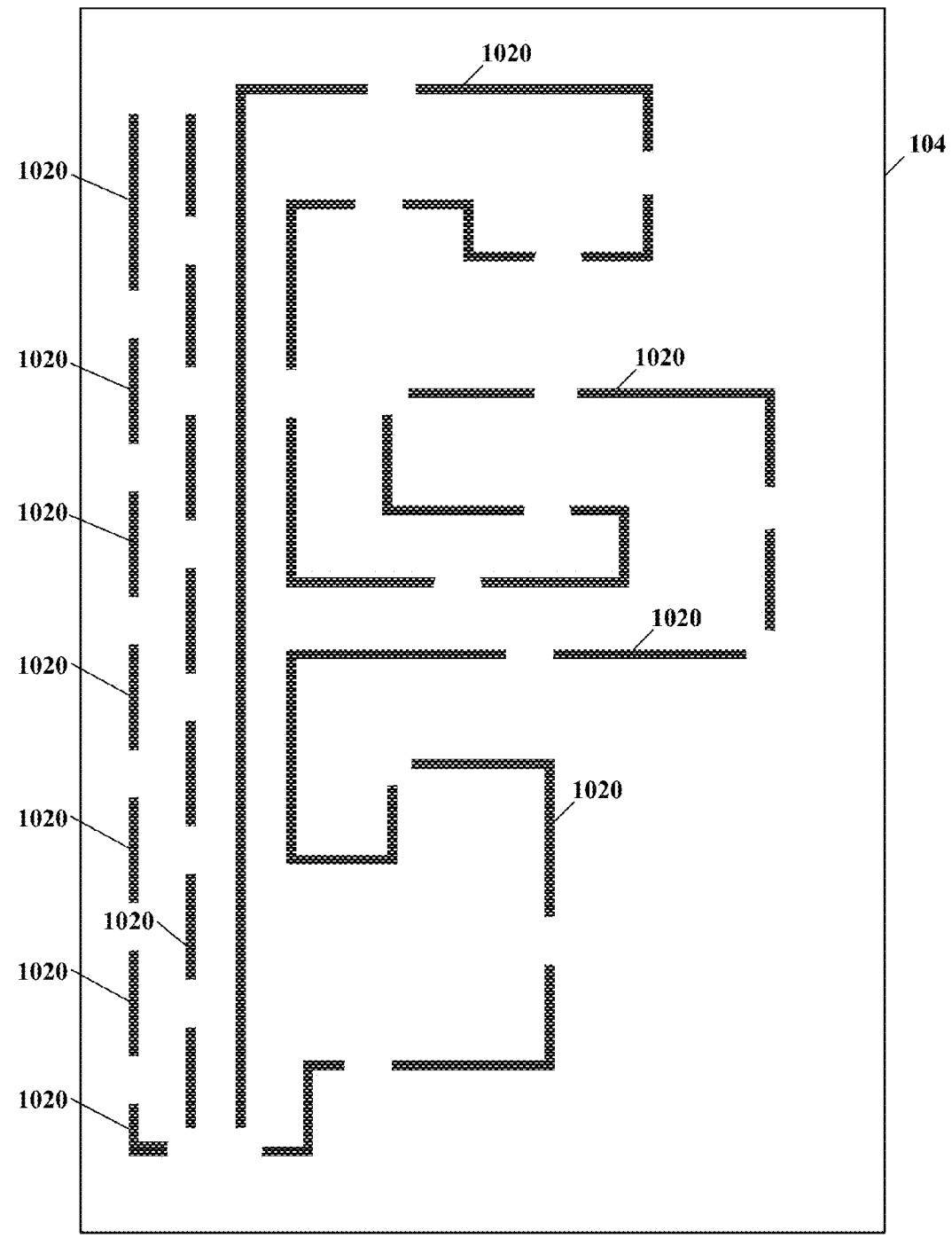
FIG. 10 illustrates a schematic plan view diagram of a plurality of sub-lithographic patterns of insulated polysilicon gates having various routing paths as shown in FIGS. 8 and 9 after being separated into independent insulated polysilicon gates on a semiconductor die, according to another specific example embodiment of this disclosure.

Referring to FIG. 10, depicted is a schematic plan view diagram of a plurality of sub-lithographic patterns of insulated polysilicon gates having various routing paths as shown in FIGS. 8 and 9 after being separated into independent polysilicon gates on the semiconductor die 104, according to another specific example embodiment of this disclosure. The via style separations may be filled in during further processing of the semiconductor die 104.

Figure 11:
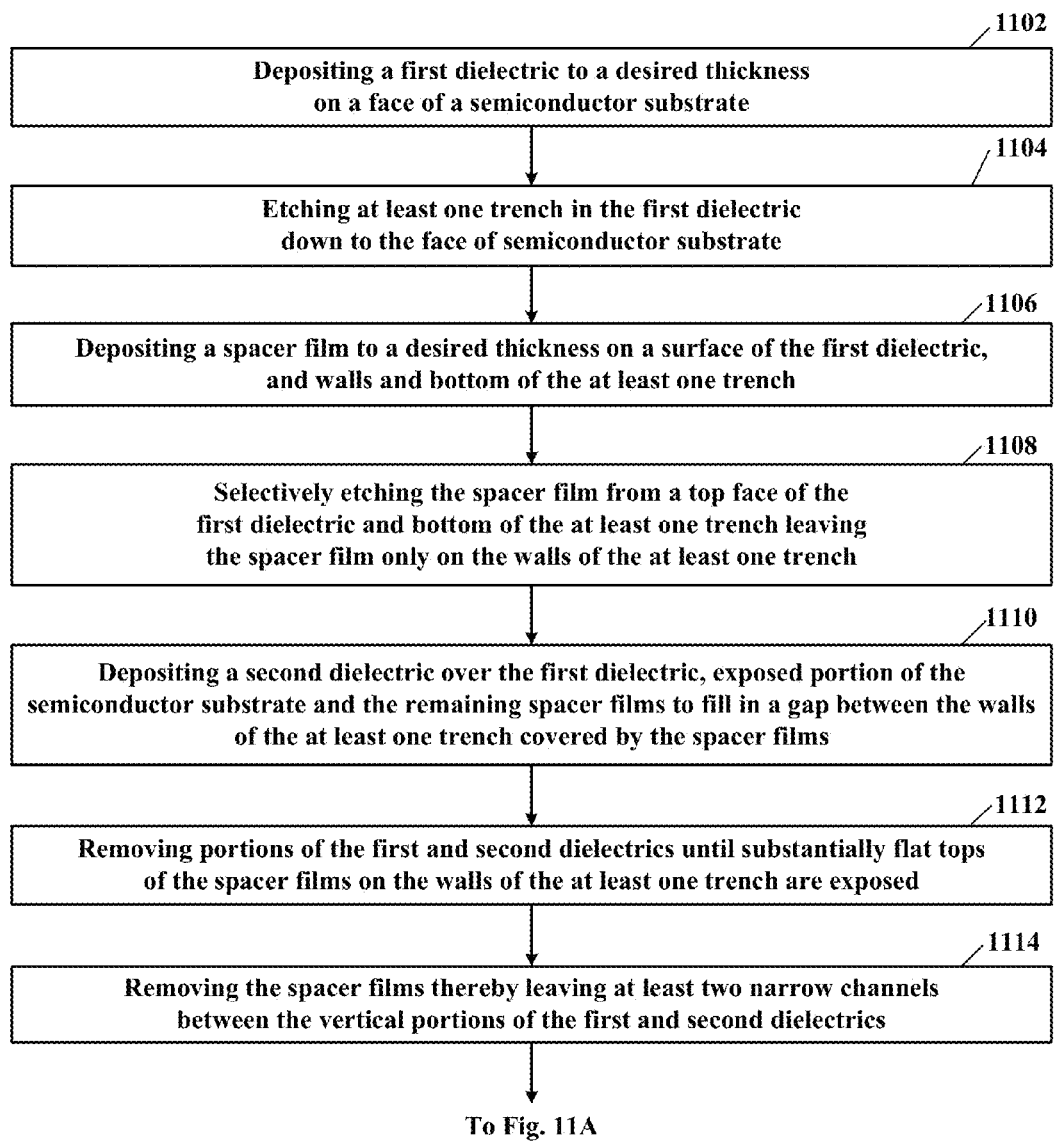
FIGS. 11 and 11A illustrate a schematic process flow diagram for forming a plurality of insulated polysilicon gates on a semiconductor die, according to the specific example embodiments of this disclosure.
Figure 11A:
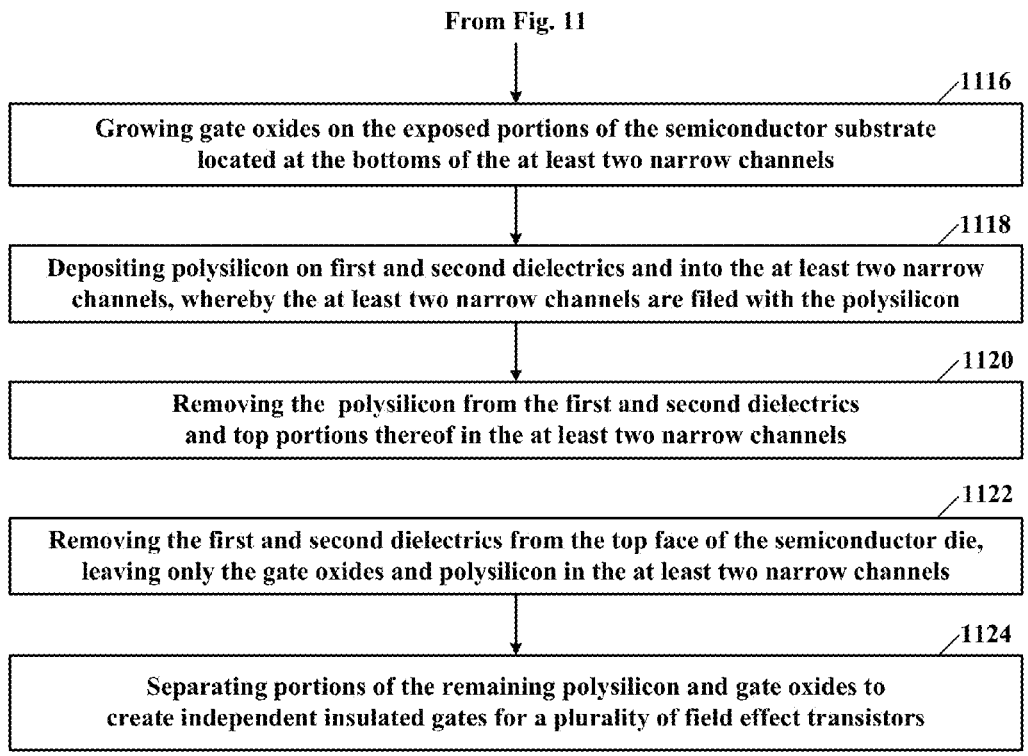

Referring to FIGS. 11 and 11A, depicted is a schematic process flow diagram for forming a plurality of sub-lithographic patterns of insulated polysilicon gates in a semiconductor die, according to the specific example embodiments of this disclosure. In step 1102 a first dielectric 312 may be deposited on a face of a semiconductor substrate (die) 104. In step 1104 at least one trench 314 may be etched into the first dielectric 312 down to a face of the semiconductor die 104. In step 1106 a spacer film 322 may be deposited to a desired thickness on the first dielectric 312, and the walls and bottom of the at least one trench 314. In step 1108 the spacer film 322 may be selectively etched from the top face of the first dielectric 312 and the exposed portion of the semiconductor die 104, leaving only spacer films 322 on the walls 316 of the at least one trench 314. In step 1110 a second dielectric 312a may be deposited over the first dielectric 312 and the remaining spacer films 322 on the walls of the at least one trench 314 sufficiently thick enough to fill in the gap therebetween. In step 1112 a portion of the second dielectric 312a may be removed, e.g., polished off, sufficiently deep enough to go past and remove the rounded tops of the spacer films 322a, otherwise there may be a re-entrant profile that may be very difficult to fill. In step 1114 the spacer films 322a may be removed from between the walls of the first and second dielectrics 312 and 312a by, for example but is not limited to, wet etching, thereby leaving ultra thin channels, e.g., trenches, furrows or grooves, therein. In step 1116 gate oxides 230 may be selectively grown on the exposed semiconductor substrate at the bottoms of the narrow channels. In step 1118 a layer of polysilicon 232 may be deposited over the first and second dielectrics 312 and 312a, into the narrow channels and over the gate oxides 230. In step 1120 the polysilicon layer 232 may be, for example but is not limited to, etching, to remove it from the top faces of the first and second dielectrics 312 and 312a, and slightly into the top portions of the narrow channels. In step 1122 the first and second dielectrics 312 and 312a are removed from the face of the semiconductor die 104, wherein the polysilicon 232 and gate oxide 230 remain on the face thereof. In step 1124 portions of the polysilicon 232 and gate oxides 230 may be separated, e.g., disconnections made therebetween, so as to create independent insulated polysilicon gates 1020 that may be used to with transistor devices fabricated on the semiconductor die 104.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for forming insulated polysilicon gates on a semiconductor integrated circuit die, said method comprising the steps of:

forming an array of ring-shaped insulated polysilicon gates by:
depositing a first dielectric on a face of a semiconductor substrate;
creating a plurality of trenches in the first dielectric down to a face of the semiconductor substrate;
depositing a spacer film on the first dielectric including walls and a bottom of the each of the trenches;
removing portions of the spacer film from a face of the first dielectric and the bottom of the each of the trenches exposing the face of the semiconductor substrate, wherein only spacer films remain on the walls of the trenches;
depositing a second dielectric over the first dielectric and between the spacer films on the walls of the trenches sufficient to fill a spaced defined therebetween;
removing a portion of the first and second dielectrics until substantially flat top portions of the spacer films are exposed between the first and second dielectrics;
removing the spacer films between the first and second dielectrics to the exposed face of the semiconductor substrate, thereby leaving an array of ring-shaped spacer-film-width channels therein, each spacer-film-width channel having a lateral width equal to a thickness of the removed spacer film;
growing gate oxides on exposed faces of the semiconductor substrate at the bottoms of the array of ring-shaped spacer-film-width channels;
depositing polysilicon on upper faces of the first and second dielectrics and into the array of ring-shaped spacer-film-width channels such that each spacer-film-width channel is fully filled with polysilicon up to and above a full height of the channel;
removing portions of the polysilicon on the upper faces of the first and second dielectrics and top portions of the polysilicon in the array of fully filled ring-shaped spacer-film-width channels, such that the removal of polysilicon reduces each spacer-film-width channel from being fully filled to being only partially filled, with top faces of the remaining polysilicon in each spacer-film-width channel being located below the upper faces of the first and second dielectrics; and
removing the first and second dielectrics from the face of the semiconductor substrate leaving thereon an array of ring-shaped polysilicon gates, each insulated by a respective gate oxide; and etching an area extending across the array of ring-shaped polysilicon gates to separate the array of ring-shaped polysilicon gates into an array of independent line-shaped polysilicon gates for an array of insulated gate transistors.

2. The method according to claim 1, wherein the step of depositing the first dielectric comprises the step of depositing the first dielectric to a thickness of from about 5 to about 1000 nanometers on the face of the semiconductor substrate.

3. The method according to claim 1, wherein the step of creating the plurality of trenches comprises the step of creating the at the least one trench having a width of from about 5 to about 1000 nanometers in the first dielectric.

4. The method according to claim 1, wherein the step of depositing the spacer film comprises the step of depositing the spacer film to a thickness of from about 5 to about 1000 nanometers.

5. The method according to claim 1, wherein the step of depositing the second dielectric comprises the step of depositing the second dielectric to a thickness of from about 5 to about 1000 nanometers.

6. The method according to claim 1, wherein the widths of the polysilicon and the gate oxides are from about 5 to about 500 nanometers.

7. The method according to claim 1, wherein the spacer film comprises Silicon Dioxide.

8. The method according to claim 1, wherein the first dielectric comprises Silicon Nitride.

9. The method according to claim 1, wherein the second dielectric comprises Silicon Nitride.

10. The method according to claim 1, wherein the step of etching an area extending across the array of ring-shaped polysilicon gates to separate the array of ring-shaped polysilicon gates into an array of independent line-shaped polysilicon gates comprises performing a reactive-ion etching (RIE).

11. The method according to claim 10, wherein the RIE is aggressive.

12. The method according to claim 1, wherein the step of removing portions of the polysilicon on the upper faces of the first and second dielectrics and top portions of the polysilicon in the at least two spacer-film-width channels, such that top faces of the remaining polysilicon in the at least two spacer-film-width channels are located below the upper faces of the first and second dielectrics comprises etching the polysilicon in the at least two spacer-film-width channels to a depth below the upper faces of the first and second dielectrics.

* * * * *